United States Patent
Hwang

(10) Patent No.: US 9,159,445 B2
(45) Date of Patent: *Oct. 13, 2015

(54) SEMICONDUCTOR DEVICE WITH FUSE ARRAY AND OPERATING METHOD THEREOF

(71) Applicant: SK hynix Inc., Gyeonggi-do (KR)

(72) Inventor: Jeong-Tae Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 43 days.

This patent is subject to a terminal disclaimer.

(21) Appl. No.: 14/103,461

(22) Filed: Dec. 11, 2013

(65) Prior Publication Data

US 2014/0369106 A1    Dec. 18, 2014

(30) Foreign Application Priority Data

Jun. 18, 2013   (KR) .................. 10-2013-0069715

(51) Int. Cl.
*G11C 17/18*    (2006.01)
*G11C 17/16*    (2006.01)
*G11C 7/20*    (2006.01)

(52) U.S. Cl.
CPC  *G11C 17/18* (2013.01); *G11C 7/20* (2013.01); *G11C 17/16* (2013.01)

(58) Field of Classification Search
CPC .......... G11C 17/16; G11C 17/18; G11C 7/20; H01L 23/5256; H01L 27/112
USPC .................. 365/96, 200, 201, 225.7, 226
See application file for complete search history.

(56) References Cited

U.S. PATENT DOCUMENTS

| 7,016,988 B2* | 3/2006 | Ramanadin ..................... 710/29 |
| 8,743,644 B2* | 6/2014 | Oh et al. ..................... 365/225.7 |
| 2003/0026160 A1* | 2/2003 | Atsumi et al. ................. 365/226 |
| 2007/0081377 A1* | 4/2007 | Zheng et al. .................... 365/96 |
| 2013/0039142 A1* | 2/2013 | Kim et al. .................. 365/233.1 |

FOREIGN PATENT DOCUMENTS

KR    1020120052454    5/2012

* cited by examiner

*Primary Examiner* — Tan T. Nguyen
(74) *Attorney, Agent, or Firm* — IP & T Group LLP

(57) ABSTRACT

A semiconductor device includes a fuse array for storing normal fuse data and pattern data through a programming operation, a boot-up control unit suitable for generating an enable signal for enabling an output of the pattern data, and a pattern detection unit suitable for detecting a pattern of the pattern data in response to the enable signal, and generating a detection signal. The fuse array outputs the normal fuse data in response to the detection signal.

18 Claims, 3 Drawing Sheets

SEMICONDUCTOR DEVICE WITH FUSE ARRAY AND OPERATING METHOD THEREOF

CROSS-REFERENCE TO RELATED APPLICATIONS

The present application claims priority of Korean Patent Application No. 10-2013-0069715, filed on Jun. 18, 2013, which is incorporated herein by reference in its entirety.

BACKGROUND

1. Field

Exemplary embodiments of the present invention relate to a semiconductor design technology, and more particularly, to a semiconductor device with a fuse array.

2. Description of the Related Art

In general, a semiconductor device such as double data rate synchronous DRAM (DDR SDRAM) includes a circuit for storing a repair target address or specific setting value, and a fuse may be used as the circuit. The fuse may store desired data through a programming operation, and the programming operation is representatively divided into a physical scheme and an electrical scheme.

The physical scheme is to cut a fuse by blowing the fuse based on data to be stored, using a laser beam. The fuse used at this time is referred to a physical-type fuse. Since the laser beam is used to cut the connection state of the fuse, the fuse is also referred to as a laser blowing-type fuse. The physical-type use has a disadvantage in that the program operation must be performed in a wafer state before packaged.

The electrical scheme is to change the connection state of a fuse by applying an over-current to the fuse based on data to be stored. The fuse used at this time is referred to as an electrical-type fuse. The electrical-type fuse may be divided into an anti-type fuse to change an open state into a short state and a blowing-type fuse to change a short state into an open state. In the case of the electrical-type fuse, a program operation may be performed in a package state, unlike the physical-type fuse. Thus, the electrical-type fuse is considered as an essential component in designing a semiconductor device.

Since the semiconductor device is required to perform more various operations, the semiconductor device is designed to perform a greater number of functions. The increase in number of functions of the semiconductor device indicates the increase in number of fuses for diversifying the respective functions. Recently, a fuse array structure has been adopted to more efficiently manage a large number of fuses.

SUMMARY

Various embodiments are directed to a semiconductor device including a fuse array that may generate stable fuse data.

In an embodiment, a semiconductor device may include a fuse array for storing normal fuse data and pattern data through a programming operation, a boot-up control unit suitable for generating an enable signal for enabling an output of the pattern data, and a pattern detection unit suitable for detecting a pattern of the pattern data in response to the enable signal, and generating a detection signal. The fuse array outputs the normal fuse data in response to the detection signal.

In an embodiment, an operating method of a semiconductor device may include performing a power-up operation and generating a power-up signal, detecting a pattern data programmed in a first fuse array, determining whether or not to enable an output of normal fuse data programmed in a second fuse array based on the detection result, and outputting the normal fuse data.

In an embodiment, a semiconductor system may include a semiconductor device with a fuse array for storing normal fuse data and pattern data through a programming operation, wherein the semiconductor device detects the pattern data outputted when a part of the plurality of fuses is enabled and generates a detection signal, and a controller suitable for controlling the semiconductor device based on the detection signal.

DETAILED DESCRIPTION

Figure 1:
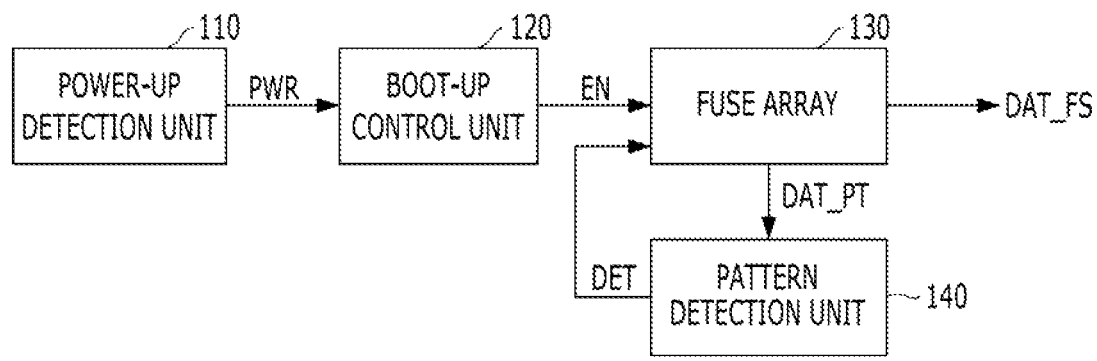
FIG. 1 is a block diagram illustrating a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. In addition, a singular form may include a plural form as long as it is not specifically mentioned in a sentence.

In the following description, an operation for loading or reading and transferring) a fuse data programmed in a fuse array into another storage circuit (e.g., registers) included in a semiconductor device is referred to as a boot-up operation.

FIG. 1 is a block diagram illustrating a semiconductor device in accordance with an embodiment of the present invention.

Referring to FIG. 1, the semiconductor device may include a power-up detection unit 110, a boot-up control unit 120, a fuse array 130, and a pattern detection unit 140.

The power-up detection unit 110 may detect whether or not the voltage level of power applied to the semiconductor device rises to a predetermined voltage level or more, and generate a power-up signal PWR. The boot-up control unit 120 may generate an enable signal EN in response to the power-up signal PWR. The fuse array 130 includes a plurality of fuses for storing predetermined fuse data through a programming operation, and a part of the plurality of fuses included in the fuse array 130 is enabled in response to the enable signal EN. Data programmed in the enabled fuses are outputted as pattern data DAT_PT. The pattern data DAT_PT will be described below in more detail. The pattern detection unit 140 may detect the pattern of the pattern data DAT_PT and generate a detection signal DET. The fuse array 130 outputs the data programmed in the fuse array 130 as fuse data DAT_FS in response to the detection signal DET.

For convenience of description, it is assumed that pattern data DAT_PT set to '1010101010' are stored in a predetermined number of fuses of the fuse array 130. The pattern data DAT_PT must be programmed before a detection operation for the pattern data DAT_PT.

First, when the power-up signal PWR is activated by detecting a power-up level, the enable signal EN is also activated. Thus, a predetermined number of fuses of the fuse array 130 are enabled to output the pattern data DAT_PT. However, the pattern data DAT_PT may not be outputted as the preset value due to concerns such as an operation mode or offset. That is, an unstable value may be outputted instead of the preset value of '1010101010'. Thus, the pattern detection unit 140 continuously performs monitoring until the pattern data DAT_PT are outputted as the preset value. That is, the pattern detection unit 140 receives the pattern data DAT_PT and detects the pattern of the pattern data DAT_PT, after the power-up operation. When the pattern data DAT_PT are outputted as the preset value of '1010101010', the detection signal DET is activated, and the fuse array 130 outputs the data programmed therein as normal fuse data DAT_FS in response to the detection signal DET.

As described above, the fuse array 130 outputs the pattern data DAT_PT in response to the enable signal EN. Since the initial pattern data DAT_PT may not be outputted as the preset value, the pattern data DAT_PT must be periodically outputted. For this operation, the enable signal EN must also be periodically outputted. Thus, the boot-up control unit 120 may include a circuit for performing a periodic operation. For example, the boot-up control unit 120 may include a circuit for controlling a refresh operation of a semiconductor memory device.

The semiconductor device in accordance with the embodiment of the present invention generates the pattern data DAT_PT before the fuse array 130 outputs the normal fuse data DAT_FS, detects that the pattern data DAT_PT are outputted as a desired pattern, and then outputs the normal fuse data DAT_FS.

Figure 2:
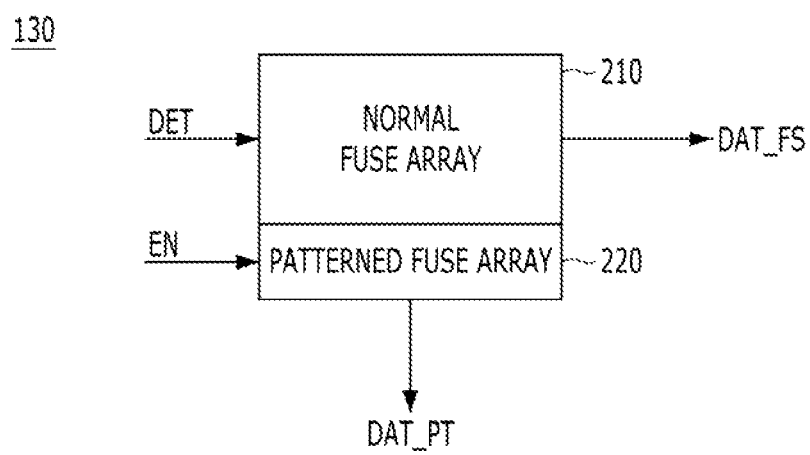
FIG. 2 is a detailed diagram illustrating a fuse array shown in FIG. 1.

FIG. 2 is a detailed diagram illustrating the fuse array 130 shown FIG. 1.

Referring to FIG. 2, the fuse array 130 includes a normal fuse array 210 and a patterned fuse array 220.

The normal fuse array 210 may be programmed with the normal fuse data DAT_FS and may output the normal fuse data DAT_FS in response to the detection signal DET. The patterned fuse array 220 may program pattern data DAT_PT and output the programmed pattern data DAT_PT in response to the enable signal EN. The normal fuse array 210 and the patterned fuse array 220 may be implemented with a single circuit, which is fabricated in the same manner under the same environment.

Hereafter, referring to FIGS. 1 to 2, a circuit operation will be described briefly.

First, the power-up detection unit 110 generates the power-up signal PWR by detecting the power-up level. When the patterned fuse array 220 corresponding to a part of the fuse array 130 is enabled in response to the enable signal EN after the power-up operation, the pattern data DAT_PT are outputted. Whenever the patterned fuse array 220 is periodically enabled in response to the enable signal EN, the pattern detection unit 140 detects whether or not the pattern data DAT_PT are stably outputted. Furthermore, when the pattern detection unit 140 detects that the pattern data DAT_PT are stably outputted, the normal fuse array 210 is enabled to output the normal fuse data DAT_FS. As a result, the normal fuse data DAT_FS outputted at this time become data outputted in a stable environment.

The semiconductor device in accordance with the embodiment of the present invention may enable the patterned fuse array 220 before the normal fuse array 210 is enabled, and previously check whether or not the normal fuse array 210 may be stably operated.

Figure 3:
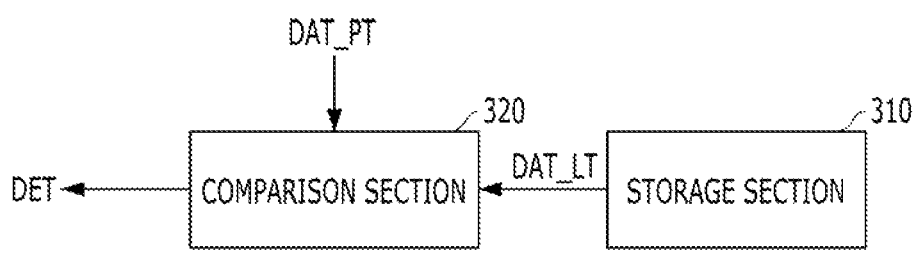
FIG. 3 is a detailed diagram illustrating a pattern detection unit shown in FIG. 1.

FIG. 3 is a detailed diagram illustrating the pattern detection unit 140 shown in FIG. 1.

Referring to FIG. 3, the pattern detection unit 140 includes a storage section 310 and a comparison section 320.

The storage section 310 stores pilot data (i.e. test pattern data) DAT_LT having the same pattern as the pattern data DAT_PT, and the comparison section 320 compares the pattern data DAT_PT to the pilot data DAT_LT stored in the storage section 310 and generates the detection signal DET. As a result, the pattern detection unit 140 activates the detection signal DET when the pattern data DAT_PT and the pilot data DAT_LT are equal to each other.

The semiconductor device in accordance with the embodiment of the present invention may compare the pattern data DAT_PT and the pilot data DAT_LT and detect whether the pattern data DAT_PT are normally outputted.

The detection signal DET is enabled when the pattern data DAT_PT are normally outputted. Thus, when the detection signal DET is used to disable the circuits used during the detection operation, that is, the boot-up control unit 120 of FIG. 1, the patterned fuse array 220 of FIG. 2, and the storage section 310 and the comparison section 320 of FIG. 3, power consumption may be reduced.

Figure 4:
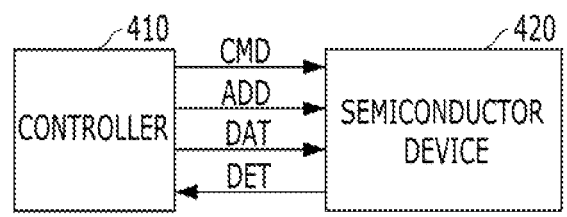
FIG. 4 is a block diagram illustrating a semiconductor system in accordance with an embodiment of the present invention.

FIG. 4 is a block diagram illustrating a semiconductor system in accordance with an embodiment of the present invention.

Referring to FIG. 4, the semiconductor device system includes a controller 410 and a semiconductor device 420.

The controller 410 may generate a command signal CMD, an address signal ADD, and a data signal DAT and transmit the generated signals to the semiconductor device 420, and the semiconductor device 420 may receive the signals transmitted from the controller 410 and perform various operations.

The semiconductor device 420 may perform the pattern detection operation described with reference to FIGS. 1 to 3, and transmit the detection signal DET generated through the pattern detection operation to the controller 410. Furthermore, the controller 410 may control the activation times of the command signal CMD, the address signal ADD, and the data signal DAT, in response to the detection signal DET.

As described with reference to FIGS. 1 to 3, the detection signal DET has information on whether the fuse array may normally output data. Thus, the semiconductor device 420 outputs the data programmed in the fuse array in response to the detection signal DET, and loads the output data into another storage circuit. For the controller 410, it may be stable to control the semiconductor device 420 in the loading time after the detection signal DET is activated. Thus, the controller 410 or the semiconductor device 420 may include a delay circuit for delaying the detection signal DET by the loading time.

The semiconductor device system in accordance with the embodiment of the present invention may control the controller 410 to provide a signal to the semiconductor device 420, after the fuse array of the semiconductor device 420 is stably enabled and the programmed data are completely loaded into the fuse array.

Figure 5:
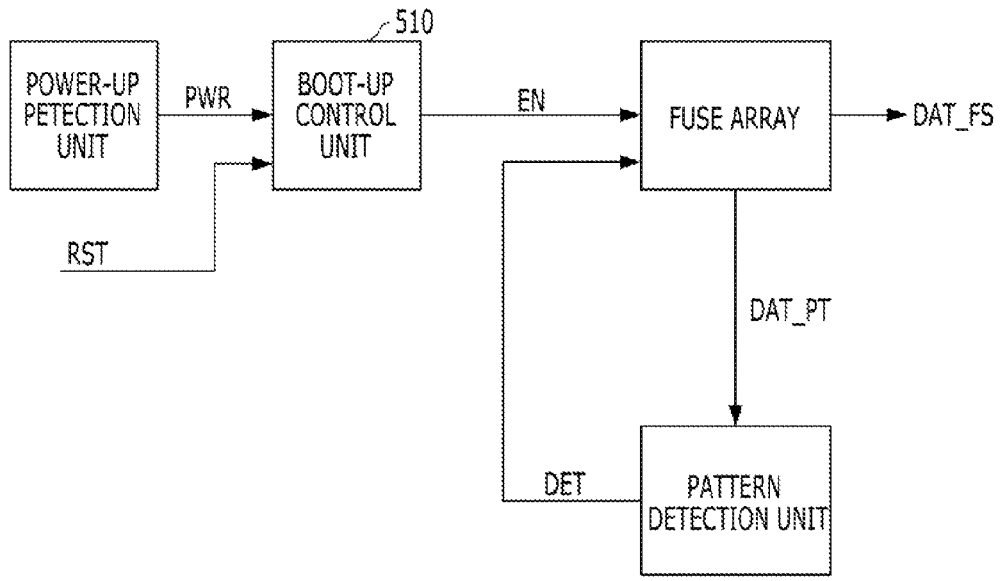
FIG. 5 is a block diagram illustrating a semiconductor device in accordance with an embodiment of the present invention.

FIG. 5 is a block diagram illustrating a semiconductor device in accordance with an embodiment of the present invention. In FIG. 5, components corresponding to those of FIG. 1 are represented by the same terms. Compared to the components of FIG. 1, only the control unit 510 among the components of FIG. 5 is changed.

Referring to FIG. 5, the boot-up control unit 510 controls whether or not to activate the enable signal EN in response to a reset signal RST. In other words, the boot-up control unit 510 may stably control whether or not to activate the enable signal EN in response to the reset signal RST, even when the power-up signal PIER is unexpectedly activated. The reset signal RST may be an internally-generated signal or an external signal applied through an external pin.

Figure 6:
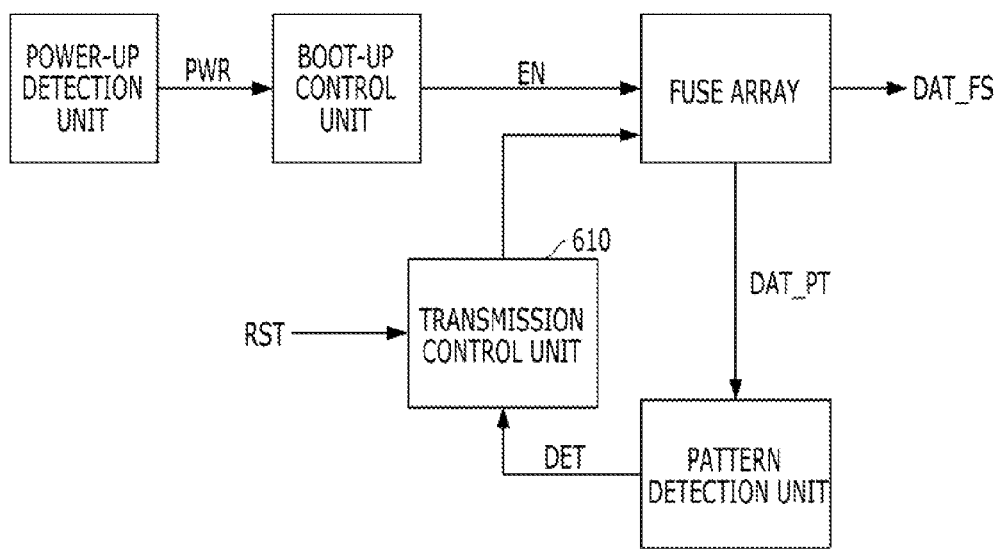
FIG. 6 is a block diagram illustrating a semiconductor device in accordance with an embodiment of the present invention.

FIG. 6 is a block diagram illustrating a semiconductor device in accordance with an embodiment of the present invention. Compared to the components of FIG. 1, the semiconductor device of FIG. 6 further includes a transmission control unit 610.

Referring to FIG. 6, the transmission unit 610 controls an operation of transmitting the detection signal DET outputted from the pattern detection unit to the fuse array in response to the reset signal RST. In other words, the transmission control unit 610 may stably control whether or not to transmit the detection signal DET based on the reset signal RST, even though the detection signal DET is unexpectedly activated. The reset signal RST may be an internally-generated signal or an external signal applied from an outside.

As described above, the semiconductor device in accordance with the embodiment of the present invention may provide an environment in which the array fuse outputs stable fuse data, which makes it possible to provide reliable fuse data to a corresponding circuit.

Furthermore, in the semiconductor device system using the semiconductor device, the controller controls the operation of the semiconductor device after the semiconductor device is completely set by the data programmed in the array fuse. Thus, the overall operations of the semiconductor device system may be precisely performed.

Although various embodiments have been described for illustrative purposes, it will be apparent to those skilled in the art that various changes and modifications may be made without departing from the spirit and scope of the invention as defined in the following claims.

In the above-described embodiments, it has been described that the pattern detection operation is performed after the power-up operation. However, the pattern detection operation may be performed based on a predetermined signal applied from an outside.

What is claimed is:

1. A semiconductor device comprising:
   a fuse array for storing normal fuse data and pattern data through a programming operation;
   a boot-up control unit suitable for generating an enable signal for enabling an output of the pattern data; and
   a pattern detection unit suitable for detecting a pattern of the pattern data in response to the enable signal, and generating a detection signal,
   wherein the fuse array outputs the normal fuse data in response to the detection signal.

2. The semiconductor device of claim 1, further comprising a power-up detection unit suitable for generating a power-up signal by detecting a power-up level, and controlling the boot-up control unit.

3. The semiconductor device of claim 2, wherein the boot-up control unit activates the enable signal at a predetermined period, after the power-up operation.

4. The semiconductor device of claim 2, wherein the boot-up control unit activates the enable signal in response to a reset signal internally-generated signal or an external signal applied through an external pin.

5. The semiconductor device of claim 1, wherein the fuse array comprises:
   a first fuse array programmed with the pattern data; and
   a second fuse array programmed with the normal fuse data.

6. The semiconductor device of claim 1, wherein the pattern detection unit comprises:
   a storage section suitable for storing pilot data having the same pattern as the pattern data; and
   a comparison section suitable for comparing the pattern data and the pilot data and generating the detection signal.

7. The semiconductor device of claim 1, further comprising a transmission control unit suitable for controlling an operation of transmitting the detection signal outputted from the pattern detection unit to the fuse array in response to the reset signal.

8. An operating method of a semiconductor device, the operating method comprising:
   performing a power-up operation and generating a power-up signal;
   detecting a pattern data programmed in a first fuse array;
   determining whether or not to enable an output of normal fuse data programmed in a second fuse array based on the detection result; and
   outputting the normal fuse data.

9. The operating method of claim 8, wherein the detecting of the pattern data is periodically performed after the power-up operation.

10. The operating method of claim 8, wherein the detecting of the data comprises comparing the pattern data to predetermined pilot data.

11. The operating method of claim 8, further comprising deactivating the detecting of the pattern data when an output signal of the detecting of the pattern data is activated.

12. The operating method of claim 8, further comprising performing a programming operation of predetermined pilot data on the enabled fuses before the pattern detecting of the data.

13. A semiconductor system comprising:
   a semiconductor device with a fuse array for storing normal fuse data and pattern data through a programming operation, wherein the semiconductor device detects the pattern data outputted when a part of the plurality of fuses is enabled and generates a detection signal; and
   a controller suitable for controlling the semiconductor device based on the detection signal.

14. The semiconductor system of claim 13, wherein the semiconductor device reads the normal fuse data programmed in the fuse array in response to the detection signal.

15. The semiconductor system of claim 14, further comprising a delay unit suitable for delaying the detection signal by a time during which the normal fuse data are read.

16. The semiconductor system of claim 13, wherein the controller controls an activation time of a signal transmitted to the semiconductor device in response to the detection signal.

17. The semiconductor system of claim 13, wherein the semiconductor device comprises:
   a fuse array comprising the plurality of fuses;
   a boot-up control unit suitable for generating an enable signal for enabling an output of the pattern data; and a pattern detection unit suitable for detecting a pattern of the pattern data in response to the enable signal and generating the detection signal.

18. The semiconductor system of claim 17, wherein the boot-up control unit activates the enable signal at a predetermined period after a power-up operation of the semiconductor device.

* * * * *